United States Patent
Schwartz et al.

(10) Patent No.: US 6,622,092 B1
(45) Date of Patent: Sep. 16, 2003

(54) PREDICTOR FOR OPTIMAL BROADBAND IMPEDANCE MATCHING

(75) Inventors: David F. Schwartz, San Diego, CA (US); J. William Helton, Del Mar, CA (US); Jeffery C. Allen, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/540,438

(22) Filed: Mar. 31, 2000

(51) Int. Cl.[7] ............................................... G06F 17/50
(52) U.S. Cl. ............................ 702/2; 743/741; 367/152
(58) Field of Search .............................. 703/2; 324/601; 367/152; 343/866, 741; 702/117; 326/30, 82

(56) References Cited

U.S. PATENT DOCUMENTS

| | | | |
|---|---|---|---|
| 4,344,093 A | * 8/1982 | Huber | 360/45 |
| 4,507,602 A | 3/1985 | Aguirre | |
| 4,992,752 A | * 2/1991 | Cioffi | 330/54 |
| 5,047,725 A | 9/1991 | Strid et al. | |
| 5,121,063 A | 6/1992 | Kerkow et al. | |
| 5,307,284 A | 4/1994 | Brunfeldt et al. | |
| 5,311,140 A | 5/1994 | Permuy | |
| 5,334,960 A | * 8/1994 | Penunuri | 333/193 |
| 5,422,860 A | * 6/1995 | Bradley et al. | 367/89 |
| 5,436,846 A | 7/1995 | Fleming-Dahl | |
| 5,557,637 A | * 9/1996 | Glynn | 375/271 |
| 5,621,331 A | * 4/1997 | Smith et al. | 324/645 |
| 5,708,587 A | * 1/1998 | Franck et al. | 364/488 |
| 5,793,640 A | 8/1998 | Wu et al. | |
| 5,794,008 A | 8/1998 | Meyers et al. | |

OTHER PUBLICATIONS

U.S. patent application publication No. 2001/0045843 A1, on Nov. 2001.*

* cited by examiner

Primary Examiner—Samuel Broda
Assistant Examiner—Thai Phan
(74) Attorney, Agent, or Firm—Allan Y. Lee; Michael A. Kagan; Peter A. Lipovsky

(57) ABSTRACT

A predictor for optimal broadband impedance matching of the present invention computes the maximum value of transducer power gain possible for any impedance matching network for a given transmission line, load, and frequency band.

3 Claims, 1 Drawing Sheet

US 6,622,092 B1

PREDICTOR FOR OPTIMAL BROADBAND IMPEDANCE MATCHING

LICENSING INFORMATION

The invention described below is assigned to the United States Government and is available for licensing commercially. Technical and licensing inquiries may be directed to Harvey Fendelman, Patent Counsel, Space and Naval Warfare Systems Center San Diego, Code D0012 Rm 103, 53510 Silvergate Avenue, San Diego, Calif. 92152; telephone no. (619)553-3818; fax no. (619)553-3821.

BACKGROUND OF THE INVENTION

The present invention relates generally to methods for estimating performance of impedance matching networks for transmission lines. More specifically, but without limitation thereto, the present invention relates to a computer program for finding the maximum transducer power gain attainable by any matching circuit for a given load and frequency band.

Engineers utilize a variety of methods for constructing broadband impedance matching networks. However, there is no systematic approach to optimizing power transfer uniformly over a selected frequency band.

Knowledge of the impedance function of a circuit element over a frequency band is important to determining its power consumption as well as to circuit design. For example, an engineer needs to know the impedance function of an antenna to match the impedance of the antenna to a transmission line. A circuit designer would benefit from the knowledge of what is the best performance possible for any impedance matching network as both a practical design goal and a quality indicator.

SUMMARY OF THE INVENTION

The present invention is directed to overcoming the problems described above, and may provide further related advantages. No embodiment of the present invention described herein shall preclude other embodiments or advantages that may exist or become obvious to those skilled in the art.

A predictor for optimal broadband impedance matching of the present invention computes the maximum transducer power gain possible for any impedance matching network for a given transmission line, load, and frequency band.

An advantage of the predictor for optimal broadband impedance matching of the present invention is that the optimal performance attainable over a selected frequency band by a lossless impedance matching network coupling a transmission line to a load may be computed directly from impedance samples of the load.

Another advantage is that the feasibility of a design objective for an impedance matching network may be determined before the network is built.

The features and advantages summarized above in addition to other aspects of the present invention will become more apparent from the description, presented in conjunction with the following drawings.

DESCRIPTION OF THE INVENTION

Figure 1:
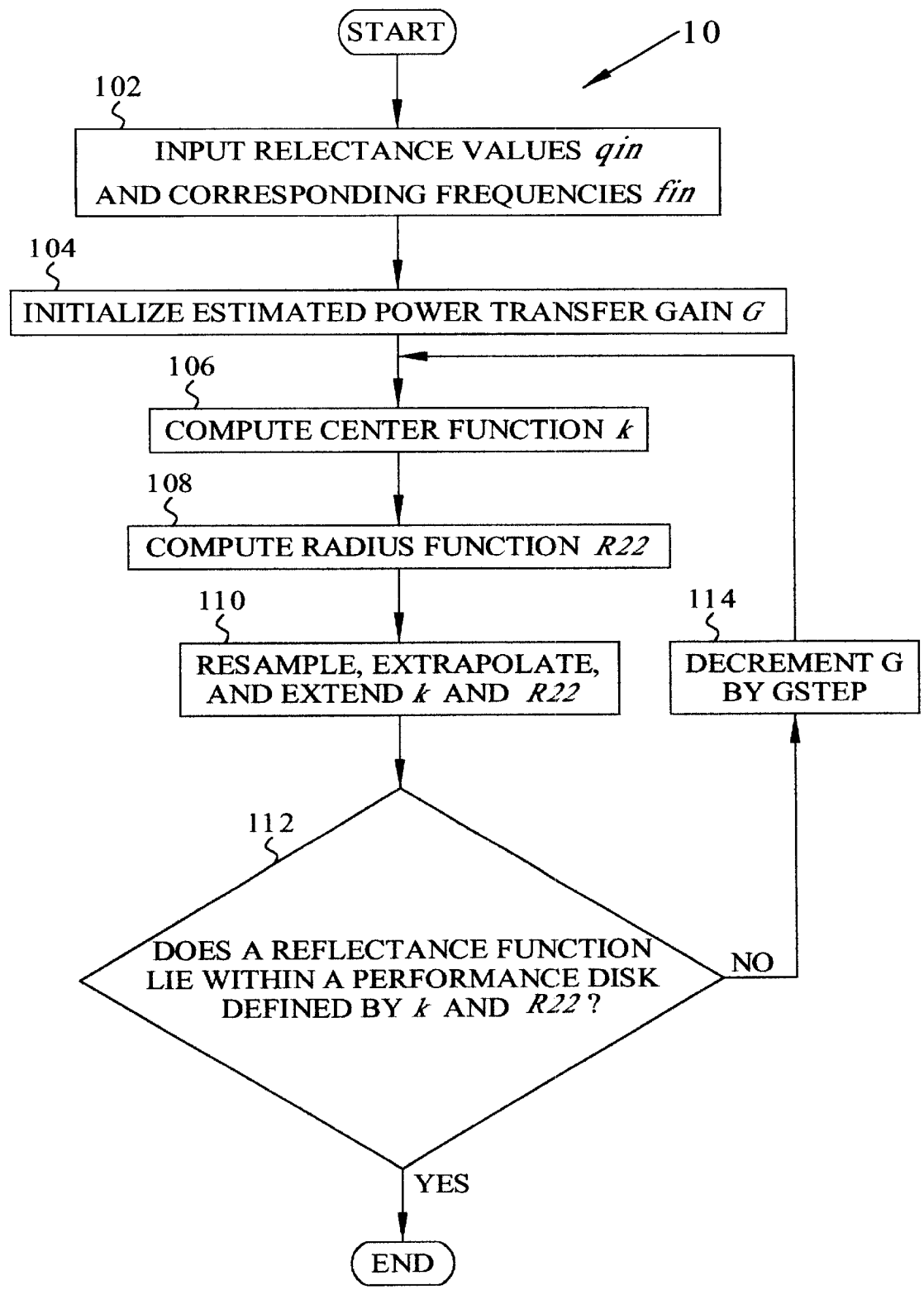
FIG. 1 is a flow chart of a computer program of the present invention.

The following description is presented solely for the purpose of disclosing how the present invention may be made and used. The scope of the invention is defined by the claims.

FIG. 1 is a flow chart of a computer program 10 of the present invention for predicting optimal broadband impedance matching. Step 102 inputs reflectance values qin measured at frequencies fin. Step 104 sets the transducer power gain to the optimum value of 100%. A desired frequency resolution parameter may also be input as $2^I$ where I is an integer. Typical values for N are 256, 512, and 1024.

At step 106 a center function k is computed that corresponds to the center of a transformation of the reflectance over a selected frequency range.

At step 108 a radius function R22 is computed that corresponds to the square of the radius of the reflectance transformation over the selected frequency range.

At step 110 k and R22 are resampled over a frequency grid defined by N and extended to include conjugate negative frequencies and extrapolated to smooth the end points at infinity.

Step 112 determines whether a reflectance function exists within the performance disk defined by k and R22. If so, the current estimate of the transducer power gain is output as optimum. Otherwise the transducer power gain is decremented at step 114 by an amount Gstep, for example, 0.001, and processing continues from step 106.

The following is an exemplary computer program of the present invention in MATLAB as a function titled AIM (Analytical Impedance Matching):

```
function G=AIM(fin, qin, N)
G=1;
Gstep=0.001;
tau=10;
f=jwgrid(N, max(f));
while tau>1;
    c=G*conj(q);
    temp1=(1-G)*abs(q.^2);
    c=c./temp1;
    c=InExSpline([f(1)/2;(3/4)*f(1); f,f(end)+f(1)/2], [0;c
       (1)/2;c;c(end)/2;0],f,0,0);
    k=[0; c(N:-1:1);conj(c((1:N-1)))];
    R2=temp1 ./(1-temp1).^2;
    R2=InExSpline([f(1)/;f(1)/2;f;f(end)+f(1)/2;
    f(end)+(3/4)*f(1)],[1;(R2(1)+1)/2;R2;(R2(end)+1)/2;1],
       f,1,1);
    R2=min(R2, 1);
    R22=[R2(N); R2(N:-1:1); conj(R2(1:N-1))];
    [h,tau]=NehariDisk(k, R22);
end
```

The function jwgrid may be calculated by the following:

```
function f=jwgrid(N, fmax)
theta=0:(pi/N):pi;
f=fmax*cot(theta(2:N+1));
```

The function InExSpline may be calculated by the following:

```
function h=InExSpline(fin, hin, f, hlb, hub)
fmin=min(fin);
fmax=max(fin);
```

```
index=find(fmin<=f & f<=fmax);
h=spline(fin, hin, f(index));
index=find(f<fmin);
h=[hlb*ones(length(index),1)]; h];
index=find(f>fmax);
h=[h; hub*ones(length(index),1)];
```
The function NehariDisk may be calculated by the following:
```
function [h,tau]=NehariDisk(c, R2)
a=exp(hilbert(log(max(R2, eps))/2));
k =c ./a;
[h,tau]=Nehari(k)
h=h .* a;
```
and the function Nehari may be calculated by the following:
```
function [h,tau]=Nehari(k)
N=length(k);
K=fft(k, N)/N;
K=K(N:=1:1+N/2);
H=hankel(k);
[U,S,V]=svd(H, 0);
tau=S(1,1);
z=exp(i*2*pi*(0:(N-1)/2);
f=polyval(V(N/2:-1:1,1), z);
h=k-tau*polyval(U(N/2:-1:1,1), conj(z))./f;
```

The search for the optimum transducer power gain is terminated when tau is returned with a value less than one.

Other modifications, variations, and applications of the present invention may be made in accordance with the above teachings other than as specifically described to practice the invention within the scope of the following claims.

We claim:

1. A method for calculating an optimum transducer power gain for an impedance matching network comprising the following steps:

(a) inputting reflectance values qin and corresponding frequency values fin over a selected frequency range;
   (b) initializing an optimum transducer power gain value G;
   (c) computing a center function k from G, fin and qin;
   (d) computing a radius function R22 from G, fin and qin;
   (e) resampling k and R22 over a defined frequency grid;
   (f) extrapolating k and R22 to smooth end points at infinity;
   (g) extending k and R22 to conjugate matched negative frequencies;
   (h) determining whether a reflectance function lies within a performance disk defined by k and R22;
   (i) decrementing G and continuing from step (c) if no reflectance function lies within the performance disk;
   (j) and outputting G as the optimum transducer power gain value if a reflectance function lies within the performance disk.

2. A computer program product comprising:

a medium for embodying a computer program for input to a computer;
   and a computer program embodied in said medium for coupling to the computer to calculate an optimum transducer power gain for an impedance matching network by performing the following functions:
   (a) inputting reflectance values qin and corresponding frequency values fin over a selected frequency range;
   (b) initializing an optimum transducer power gain value G;
   (c) computing a center function k from G, fin and qin;
   (d) computing a radius function R22 from G, fin and qin;
   (e) resampling k and R22 over a defined frequency grid;
   (f) extrapolating k and R22 to smooth end points at infinity;
   (g) extending k and R22 to conjugate matched negative frequencies;
   (h) determining whether a reflectance function lies within a performance disk defined by k and R22;
   (i) decrementing G and continuing from step (c) if no reflectance function lies within the performance disk;
   (j) and outputting G as the optimum transducer power gain value if a reflectance function lies within the performance disk.

3. The computer program product of claim 2 wherein G is calculated substantially as exemplified by the following:

```
function G=AIM(fin, qin, N)
G=1;
Gstep=0.001;
tau=10;
f=jwgrid(N, max(f));
while tau>1;
    c=G*conj(q);
    temp1=(1-G)*abs(q.^2);
    c=c./temp1;
    c=InExSpline([f(1)/2;(3/4)*f(1);f;f(end)+f(1)/2], [0;c
       (1)/2;c;c(end)/2;0],f,0,0);
    k=[0;c(N:-1:1); conj(c((1:N-1)))];
    R2=temp1./(1-temp1).^2;
    R2=InExSpline([f(1)/;f(1)/2;f;f(end)+f(1)/2;
f(end)+(3/4)*f(1)],[1;(R2(1)+1)/2;R2;(R2(end)+1)/2;1],
    f,1,1);
    R2=min(R2, 1);
    R22=[R2(N); R2(N:-1:1); conj(R2(1:N-1))];
    [h, tau]=NehariDisk(k, R22);
end
``` wherein N is a frequency resolution parameter, Gstep is a gain decrement value, tau is a loop condition, c, temp1, and R2 are temporary variables, k is the center function, and R22 is the radius function;

wherein the function jwgrid is calculated substantially as exemplified by the following:
```
function f=jwgrid(N, fmax)
theta=0:(pi/N):pi;
f=fmax*cot(theta(2:N+1));
``` wherein the function InExSpline is calculated substantially as exemplified by the following:
```
function h=InExSpline(fin, hin, f, hlb, hub)
fmin=min(fin);
fmax=max(fin);
index=find(fmin<=f & f<=fmax);
h=spline(fin, hin, f(index));
index=find(f<fmin);
h=[hlb*ones(length(index),1)]; h];
index=find(f>fmax);
h=[h; hub*ones(length(index),1)];
``` wherein the function NehariDisk is calculated substantially as exemplified by the following:
```
function [h,tau]=NehariDisk(c, R2)
a=exp(hilbert(log(max(R2, eps))/2));
``` k=c./a;
[h,tau]=Nehari(k)
h=h.*a;
wherein the function Nehari is calculated substantially as exemplified by the following:
function [h,tau]=Nehari(k)
N=length(k);
K=fft(k, N)/N;
K=K(N:−1:1+N/2);
H=hankel(k);
[U,S,V]=svd(H, 0);
tau=S(1,1);
z=exp(i*2*pi*(0:(N−1)/2);
f=polyval(V(N/2:−1:1,1), z);
h=k−tau*polyval(U(N/2:−1:1,1), conj(z))./f;
and wherein tau is returned with a value less than one when G substantially equals the optimum transducer power gain.

* * * * *